(12) United States Patent  
Nakanishi et al.

(10) Patent No.: US 8,455,997 B2  
(45) Date of Patent: Jun. 4, 2013

(54) HIGH POWER SEMICONDUCTOR DEVICE

(75) Inventors: Hidetoshi Nakanishi, Tokyo (JP); Yuji Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/309,754

(22) Filed: Dec. 2, 2011

(65) Prior Publication Data

US 2012/0261811 A1  Oct. 18, 2012

(30) Foreign Application Priority Data

Apr. 13, 2011  (JP) .................................. 2011-089353

(51) Int. Cl.  
  *H01L 23/34*   (2006.01)
(52) U.S. Cl.  
  USPC .................................. 257/712; 257/E31.101
(58) Field of Classification Search  
  CPC .. H01L 2924/01078; H01L 2224/48091; H01L 2924/01079  
  USPC .................................. 257/712, 717, E23.101  
  See application file for complete search history.

(56) References Cited

U.S. PATENT DOCUMENTS

| | | | | |
|---|---|---|---|---|
| 4,172,261 | A * | 10/1979 | Tsuzuki et al. | 257/717 |
| 6,201,696 | B1 * | 3/2001 | Shimizu et al. | 361/704 |
| 2008/0157310 | A1 * | 7/2008 | Lee et al. | 257/676 |

FOREIGN PATENT DOCUMENTS

JP  2000-307058  11/2000

* cited by examiner

*Primary Examiner* — Nikolay Yushin  
(74) *Attorney, Agent, or Firm* — Oblon, Spivak, McClelland, Maier & Neustadt, L.L.P.

(57) ABSTRACT

A semiconductor device includes an insulating substrate, a metal pattern formed on the insulating substrate, a power terminal bonded onto the metal pattern, and a plurality of power chips bonded onto the metal pattern. The plurality of power chips are all separated from the power terminal by a distance sufficient to thermally isolate the plurality of power chips from the power terminal.

3 Claims, 3 Drawing Sheets

HIGH POWER SEMICONDUCTOR DEVICE

BACKGROUND OF THE INVENTION

1. Field of the Invention

The present invention relates to a semiconductor device used, e.g., for motor control in industrial equipment.

2. Background Art

Japanese Laid-Open Patent Publication No. 2000-307058 discloses a semiconductor device in which power terminals and power chips are connected to each other through metal patterns.

It has been found, however, that heat generated in the power chips is transferred through the metal patterns to the power terminals, so that in some cases the power terminals are heated to a high temperature.

SUMMARY OF THE INVENTION

The present invention has been made to solve this problem. It is, therefore, an object of the present invention to provide a semiconductor device in which the power terminals are prevented from being heated to a high temperature.

According to one aspect of the present invention, a semiconductor device includes an insulating substrate, a metal pattern formed on the insulating substrate, a power terminal bonded onto the metal pattern, and a plurality of power chips bonded onto the metal pattern. The plurality of power chips are all separated from the power terminal by a distance sufficient to thermally isolate the plurality of power chips from the power terminal.

Other and further objects, features and advantages of the invention will appear more fully from the following description.

DETAILED DESCRIPTION OF THE PREFERRED EMBODIMENT

Embodiment

Figure 1:
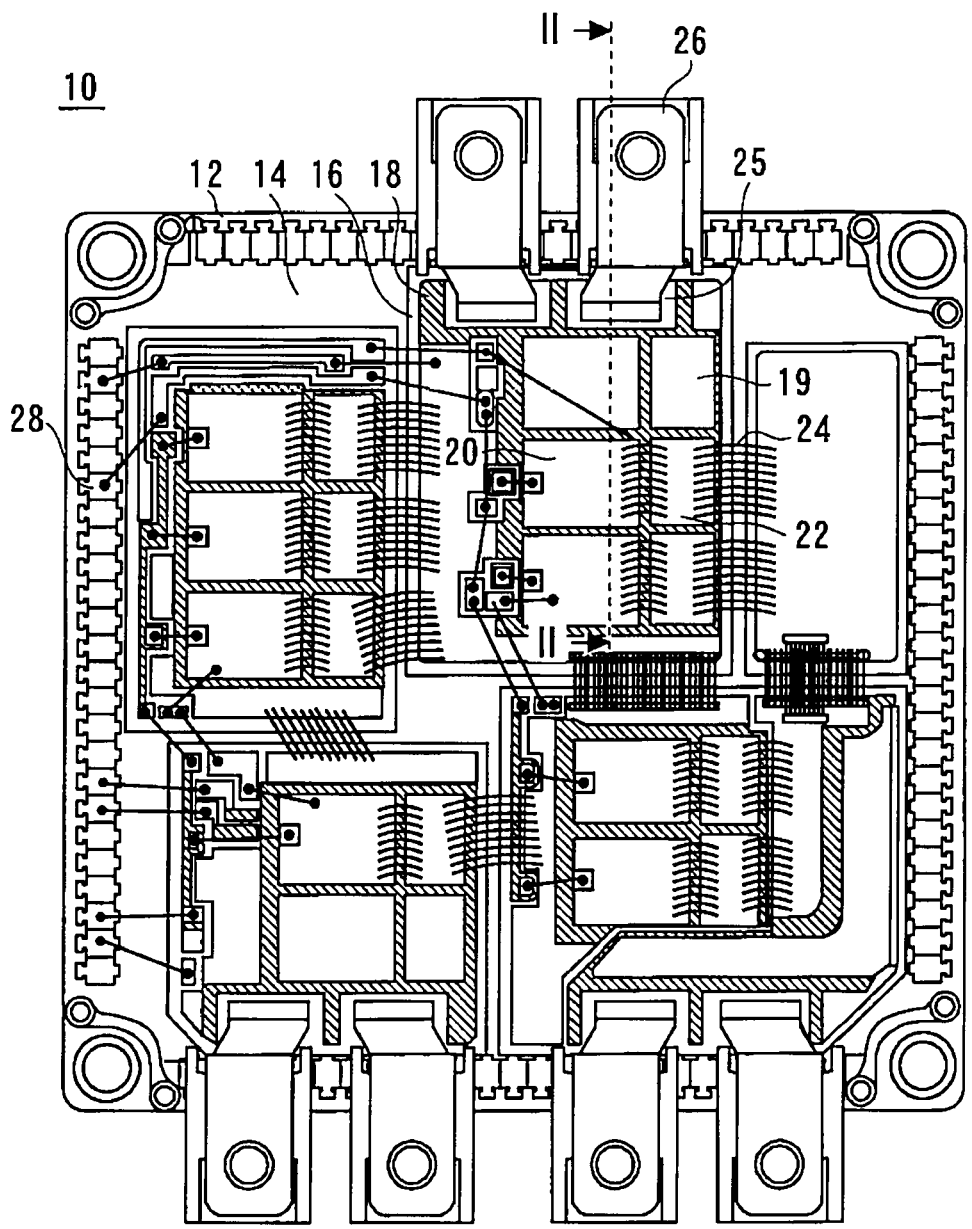
FIG. 1 is a plan view of a semiconductor device in accordance with an embodiment of the present invention.

FIG. 1 is a plan view of a semiconductor device 10 in accordance with an embodiment of the present invention. The semiconductor device 10 has a case 12. A Cu base 14 is fixed to the case 12. A plurality of insulating substrates 16 are fixed onto the Cu base 14. The insulating substrates 16 are formed of AlN ceramic. A metal pattern 18 is formed on each insulating substrate 16. These metal patterns 18 are formed of copper.

An IGBT chip 20 is bonded onto the metal pattern 18 on one of the insulating substrates 16. Further, a diode chip 22 is also bonded onto the metal pattern 18. These chips are bonded to the metal pattern by solder. The metal pattern 18, the IGBT chip 20, and the diode chip 22 are electrically connected to one another by wires 24. The IGBT chip 20 and the diode chip 22 may be referred to as "power chips." The exposed solder on the surface of the metal pattern 18, which solder has no power chip thereon, is referred to herein as the "solder 19."

A power terminal 26 is bonded onto the metal pattern 18 by solder 25. The main current of the semiconductor device 10 flows through the power terminal 26. A signal terminal 28 is fixed to a side of the case 12. The signal terminal 28 is connected to the gate of the IGBT chip 20.

Figure 2:
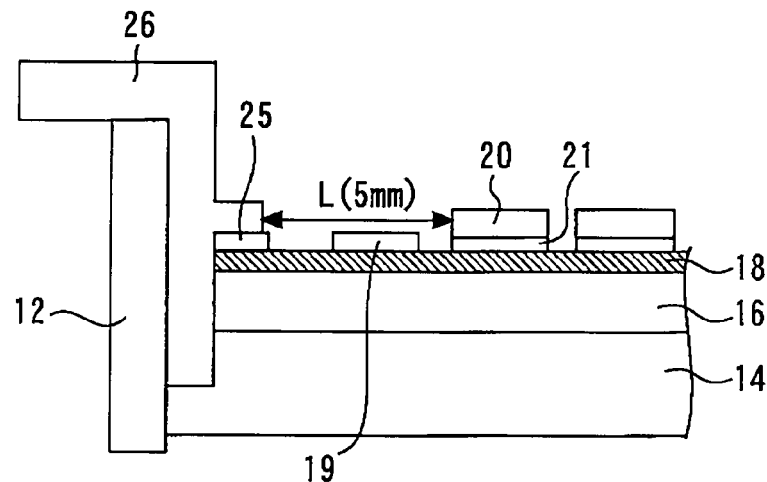
FIG. 2 is a cross-sectional view taken along dashed line II-II of FIG. 1 and viewed in the direction of the arrows.

FIG. 2 is a cross-sectional view taken along dashed line II-II of FIG. 1 and viewed in the direction of the arrows. The power terminal 26 is bonded to the metal pattern 18 by the solder 25. The IGBT chip 20 is bonded to the metal pattern 18 by solder 21. The power terminal 26 is spaced a distance of 5 mm from the closest power chip (i.e., the IGBT chip 20). The distance between the power terminal 26 and the IGBT chip 20 is indicated by L in FIG. 2. That is, the distance L is the smallest of the distances between the power terminal 26 and the plurality of power chips of the semiconductor device of the first embodiment. In other words, all the power chips are separated from the closest power terminal 26 by a distance of 5 mm or more.

Figure 3:
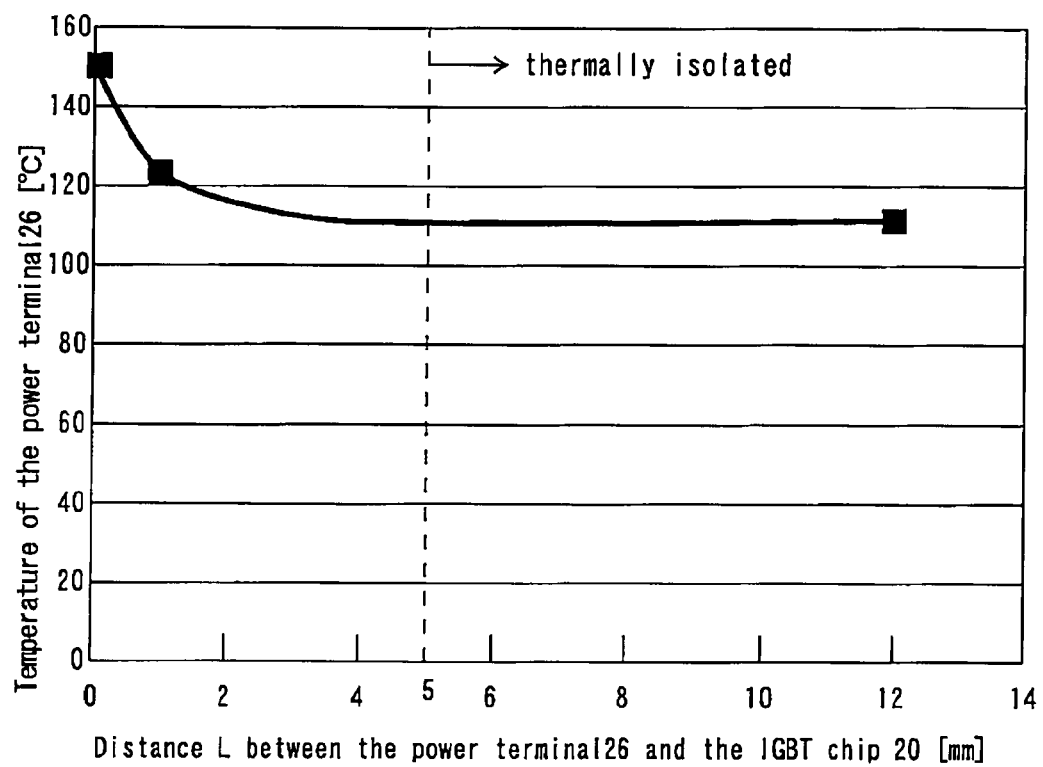
FIG. 3 is a graph showing the relationship between the temperature of the power terminal and the distance L.

FIG. 3 is a graph showing the relationship between the temperature of the power terminal 26 and the distance L. When the distance L is smaller than 5 mm, the smaller the distance L, the higher the temperature of the power terminal 26, since the terminal is affected by the heat generated in the power chip. When the distance L is 5 mm or more, on the other hand, there is no significant relation between the temperature of the power terminal 26 and the distance L. This means that when the distance L is 5 mm or more, the power terminal 26 can be thermally isolated from the IGBT chip 20. The term "thermally isolated" does not necessarily mean that the power terminal 26 is completely prevented from receiving heat from the IGBT chip 20 and other chips. Instead it means that the power terminal 26 receives practically no heat from the IGBT chip 20 and other chips.

The primary factors in increasing the temperature of the power terminal 26 are the large current flowing in the terminal and the heat conduction from the power chips. It has been found in some cases that the power terminal is heated to a high temperature due to these factors. In the semiconductor device 10 of the present embodiment, however, the power terminal 26 is thermally isolated from the power chips, thereby preventing the temperature of the terminal from being increased by heat conducted from the power chips. In this way the power terminal 26 can be prevented from being heated to a high temperature.

The semiconductor device of the present invention is characterized in that all of the plurality of power chips are separated from the power terminal 26 by a distance sufficient to thermally isolate these power chips from the power terminal. Therefore, although in the above embodiment the power chips of the semiconductor device are IGBT chips and diode chips, it is to be understood that in other embodiments the semiconductor device may include only either IGBT chips or diode chips, or alternatively it may include other heat generating chips. Further, the material of the metal patterns 18 is not limited to Cu.

Further the present invention does not necessarily require that the distance between each power terminal and the closest power chip be 5 mm or more. The distance required to thermally isolate each power terminal from the power chips may be determined by the material of the metal pattern and the maximum temperature of each power chip, etc.

Figure 4:
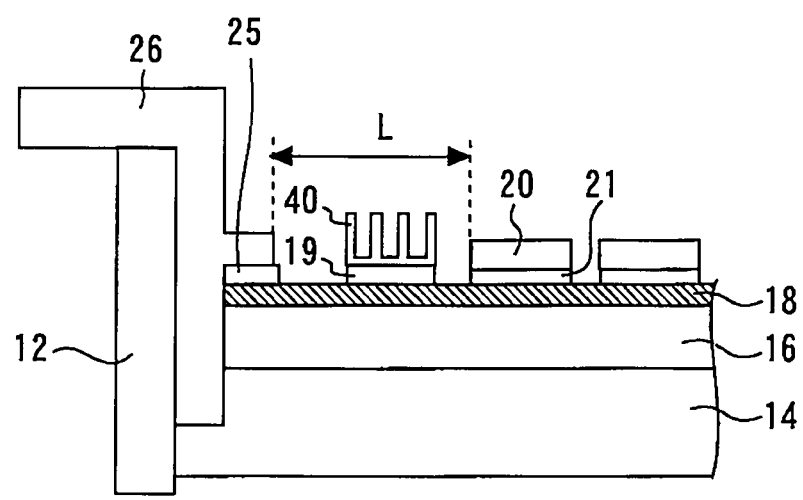
FIG. 4 is a cross-sectional view showing a heat sink bonded to the metal pattern between the power terminal and the IGBT chip by the solder.

In the semiconductor device 10 of the present embodiment, the area between the power terminal 26 and the IGBT chip 20 is covered with the solder 19, but does not have any component bonded thereto, as shown in FIG. 2. It is to be understood, however, that the present invention does not necessarily require that this area be such dead space. For example, a heat sink may be bonded onto the metal pattern 18 between the power terminal 26 and the power chip. FIG. 4 is a cross-sectional view showing a heat sink 40 bonded to the metal pattern 18 between the power terminal 26 and the IGBT chip 20 by the solder 19. The heat sink 40 has cooling fins. The use of the heat sink 40 makes it possible to reduce the distance L required to thermally isolate the power terminal 26 from the IGBT chip 20.

In accordance with the present invention, the power terminal is thermally isolated from the power chips so as to prevent the power terminal from being heated to a high temperature.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-089353, filed on Apr. 13, 2011 including specification, claims, drawings and summary, on which the Convention priority of the present application is based, are incorporated herein by reference in its entirety.

What is claimed is:

1. A semiconductor device comprising:
   an insulating substrate;
   a metal pattern formed on said insulating substrate;
   a power terminal bonded onto said metal pattern;
   an exposed solder pattern without any electronic component bonded thereto or connected thereto, the exposed solder pattern bonded onto the metal pattern between the power terminal and the plurality of power chips;
   a plurality of power chips bonded onto said metal pattern;
   wherein said plurality of power chips are all separated from said power terminal by a distance sufficient to thermally isolate said plurality of power chips from said power terminal.

2. The semiconductor device according to claim 1, wherein a heat sink is bonded onto said exposed solder pattern between said power terminal and said plurality of power chips.

3. The semiconductor device according to claim 1, wherein:
   said metal pattern is formed of copper;
   each of said plurality of power chips is an insulated gate bipolar transistor (IGBT) chip or a diode chip; and
   the distance between said power terminal and the closest of said plurality of power chips is 5 mm or more.

* * * * *